United States Patent
Yamamoto et al.

(10) Patent No.: US 7,321,257 B2
(45) Date of Patent: Jan. 22, 2008

(54) SEMICONDUCTOR DEVICE CAPABLE OF DETECTING AN OPEN BONDING WIRE USING WEAK CURRENT

(75) Inventors: Isao Yamamoto, Kyoto (JP); Koichi Miyanaga, Kyoto (JP)

(73) Assignee: Rohm Co., Ltd. (JP)

(*) Notice: Subject to any disclaimer, the term of this patent is extended or adjusted under 35 U.S.C. 154(b) by 96 days.

(21) Appl. No.: 10/931,445

(22) Filed: Sep. 1, 2004

(65) Prior Publication Data

US 2005/0057301 A1    Mar. 17, 2005

(30) Foreign Application Priority Data

Sep. 12, 2003    (JP) .............................. 2003-322295

(51) Int. Cl.
  *G05F 1/10*    (2006.01)
  *G05F 3/02*    (2006.01)
(52) U.S. Cl. ............... 327/540; 327/541; 327/564; 327/565; 323/316
(58) Field of Classification Search ............... 327/325, 327/540, 541, 564, 565; 323/316
See application file for complete search history.

(56) References Cited

U.S. PATENT DOCUMENTS

| | | | | |
|---|---|---|---|---|
| 3,287,567 A | * | 11/1966 | Gaon | 327/325 |
| 3,497,721 A | * | 2/1970 | Dexter | 327/331 |
| 4,443,717 A | * | 4/1984 | Hague | 327/85 |
| 5,335,203 A | * | 8/1994 | Ishii et al. | 365/226 |
| 5,587,598 A | * | 12/1996 | Hatanaka | 257/355 |
| 5,721,656 A | * | 2/1998 | Wu et al. | 361/56 |
| 6,111,457 A | * | 8/2000 | Lim et al. | 327/541 |
| 6,329,863 B1 | * | 12/2001 | Lee et al. | 327/309 |
| 6,411,155 B2 | * | 6/2002 | Pezzani | 327/531 |
| 6,753,204 B1 | * | 6/2004 | Mayer | 438/107 |
| 6,777,996 B2 | * | 8/2004 | Smith, Jr. | 327/309 |
| 6,919,774 B2 | * | 7/2005 | Ritchey et al. | 333/81 R |
| 7,055,045 B1 | * | 5/2006 | Gaboriau et al. | 713/300 |
| 2003/0213999 A1 | * | 11/2003 | Lee et al. | 257/370 |
| 2004/0075488 A1 | * | 4/2004 | Yamamoto et al. | 327/541 |

FOREIGN PATENT DOCUMENTS

JP    11-111785    4/1999

OTHER PUBLICATIONS

"Multiplex". Focal Dictionary of Telecommunications, Focal Press (1999). Retrieved Jul. 7, 2006, from xreferplus. http://www.xreferplus.com/entry/986985.*
Office Action for the corresponding Chinese Patent Application No. 200410068702.X dated Dec. 8, 2006.
Japanese Office Action dated Oct. 4, 2005 with English translation for corresponding Japanese Patent Application No. 2003-322295.

* cited by examiner

*Primary Examiner*—Tuan T. Lam
*Assistant Examiner*—William Hernandez
(74) *Attorney, Agent, or Firm*—Cantor Colburn LLP

(57) ABSTRACT

An IC chip has a series regulator built therein. A battery voltage is applied to an input pin. An output of a transistor constituting the series regulator occurs at an output pin via an output pad. A feedback signal derived from an output voltage occurs at an end of a voltage division resistor via a feedback pad. Diodes connect the output pad and the feedback pad.

4 Claims, 5 Drawing Sheets

SEMICONDUCTOR DEVICE CAPABLE OF DETECTING AN OPEN BONDING WIRE USING WEAK CURRENT

BACKGROUND OF THE INVENTION

1. Field of the Invention

The present invention relates to a semiconductor device and an electronic apparatus and, more particularly, to a semiconductor device and an electronic apparatus on which the semiconductor device is mounted, the semiconductor device having a built-in IC chip, and IC chip pads and external terminals of the IC (hereinafter, simply referred to as "terminal") being connected to each other by a bonding wire (hereinafter, simply referred to as "wire").

2. Description of the Related Art

Some semiconductor devices use a specification that requires a signal of a relatively large current to be supplied. In such cases, the signal may be fed to a plurality of pads of the IC chip so that the plurality of pads share the task of feeding the current. Each of the plurality of pads is connected to an external terminal by a wire so that the device has an appearance of having a single signal line at the terminal. Internally, two wires connect two pads to one terminal.

When one of the two wires is open so as to cause failure, the device will be malfunctioning. For example, a required level of current is not produced or an excessive current flows in the remaining wires so that long-term reliability suffers. When one of the two wires is disconnected, the signal still occurs at the terminal so that failure cannot be detected by a normal test. Japanese Patent Laid Open Publication H11-111785 discloses a technology in which resistors are used to connect the pads so that variation in resistance due to open wire is detected.

According to the technology of the related art, however, detection of a failure is impossible unless a relatively large test current is fed so as to cause a voltage drop. Some testers are not capable of feeding a relatively large current. From another perspective, it is desirable that detection of a failure using a weak current be assured in order to ensure that the wire is not heavily loaded by the test current.

Related Art List

JPA laid open H11-111785

SUMMARY OF THE INVENTION

The present invention has been achieved with a view to resolving the above problems and has an object of providing a semiconductor device and an electronic apparatus on which the semiconductor device is mounted, in which detection of a failure using a weak current is possible.

The semiconductor device according to the present invention includes: an IC chip having first and second pads; a terminal connected to both the first and second pads, wherein a first signal connected to the first pad and a second signal connected to the second pad are coupled by a diode. Only one diode may be provided in a direction from the first signal to the second signal or in the opposite direction. Alternatively, two diodes may be provided in both directions.

When an open wire occurs, malfunction is detected as a failure of the circuit connected to the first signal or the circuit connected to the second signal to operate in an IC chip. Malfunction may also be detected as an error occurring earlier than normal in a test using a reduced voltage test, i.e., a test using a low power supply voltage, due to the forward drop voltage of the diode. By using diodes, the test is possible using a weak current.

Where the terminal is an input terminal, the semiconductor device may further include: a regulator circuit for generating a desired voltage from a power supply voltage applied to the input terminal; and an output terminal for outputting the desired voltage thus generated, wherein the regulator circuit may be configured to receive the power supply voltage by two systems including the first signal and the second signal and generate the desired voltage.

Where the terminal is an output terminal, the semiconductor device according to another mode of the present invention may further include: an input terminal to which a predetermined power supply voltage is applied; and a regulator circuit for generating a desired voltage from the power supply voltage, wherein the desired voltage may be transmitted to the first signal or the second signal.

The semiconductor device according to another mode of the present invention includes: an input terminal to which a power supply voltage is applied; a regulator circuit for generating a desired voltage from the power supply voltage; and an output terminal for outputting the desired voltage thus generated, wherein a plurality of IC chip pads are provided for at least one of the input terminal and the output terminal so that a signal transmission channel is multiplexed, and the multiplexed signal transmission channels are coupled to each other by a diode.

Still another mode of the present invention relates to an electronic apparatus on which a semiconductor device and a load device are mounted, the semiconductor device including: an input terminal to which a power supply voltage is applied; a regulator circuit for generating a desired voltage from the power supply voltage; and an output terminal for outputting the desired voltage thus generated, wherein a plurality of IC chip pads are provided for at least one of the input terminal and the output terminal so that a signal transmission channel is multiplexed, and the multiplexed signal transmission channels are coupled to each other by a diode either inside the semiconductor device or at an interface between the semiconductor device and the load device.

This summary of the invention does not necessarily describe all necessary features so that the invention may also be a sub-combination of these described features.

DETAILED DESCRIPTION OF THE INVENTION

The invention will now be described based on the following preferred embodiments which do not intend to limit the scope of the present invention but exemplify the invention. All of the features and the combinations thereof described in the embodiments are not necessarily essential to the invention.

First Embodiment

Figure 1:
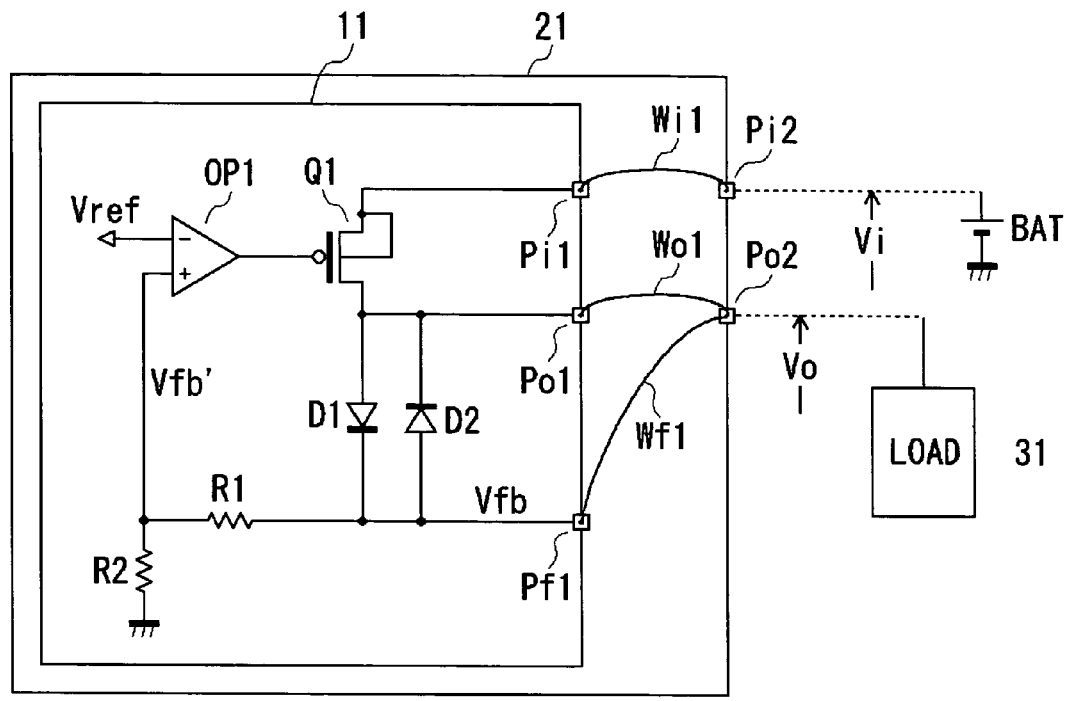
FIG. 1 shows a construction of a semiconductor device according to a first embodiment of the present invention.

FIG. 1 shows a circuit of a semiconductor device according to a first embodiment of the present invention. An IC chip 11 constitutes a series regulator. The IC chip 11 is provided with an input pad Pi1 for receiving an input voltage Vi from a power source, an output pad Po1 for outputting an output voltage Vo for control and a feedback pad Pf1 for feeding back the output voltage Vo output outside as a feedback voltage Vfb.

A transistor Q1 of the PMOS type is connected between the input pad Pi1 and the output pad Po1. A first diode D1 and a second diode D2 are connected between the output pad Po1 and the feedback pad Pf1. The forward direction of the first diode D1 is from the output pad Po1 to the feedback pad Pf1 and the forward direction of the second diode D2 is from the feedback pad Pf1 to the output pad Po1. The second diode D2 is not necessary for detection of an open wire described later and may be omitted. Hereinafter, the first diode D1 and the second diode D2 will be generically referred to as diodes.

The inverting input terminal (−) of an operational amplifier OP1 receives a reference voltage Vref and the non-inverting input terminal (+) receives a compared voltage Vfb' obtained by dividing a feedback voltage Vfb by first and second voltage division resistors R1 and R2. A difference between the reference voltage Vref and the compared voltage Vfb' is output from the operational amplifier Op1 and supplied to the gate of the transistor Q1.

A semiconductor device 21 is provided with an input terminal Pi2 and an output terminal Po2 that are lead terminals. The input terminal Pi2 is connected to the input pad Pi1 by an input wire Wi1 and the output terminal Po2 is connected to the output pad Po1 by an output wire Wo1. The output terminal Po2 is also connected to the feedback pad pf1 by a feedback wire Wf1.

As shown in the figure, the input terminal Pi2 is connected to a battery BAT provided as a power source. For example, a voltage Vi of 4.5V is supplied. The output terminal Po2 supplies an output voltage Vo of 3.0V to a load device 31, for example. In the semiconductor 21, the reference voltage Vref and the compared voltage Vfb' are controlled to be equal to each other.

In this embodiment, diodes are connected between the output pad Po1 and the feedback pad Pf1 in the IC chip 11. In the absence of the diodes, when the feedback wire Wf1 is open, feedback does not work and the output voltage Vo is raised almost to the level of the input voltage Vi. This will sometimes damage the load device 31. Providing diodes avoids such a situation.

Figure 2:
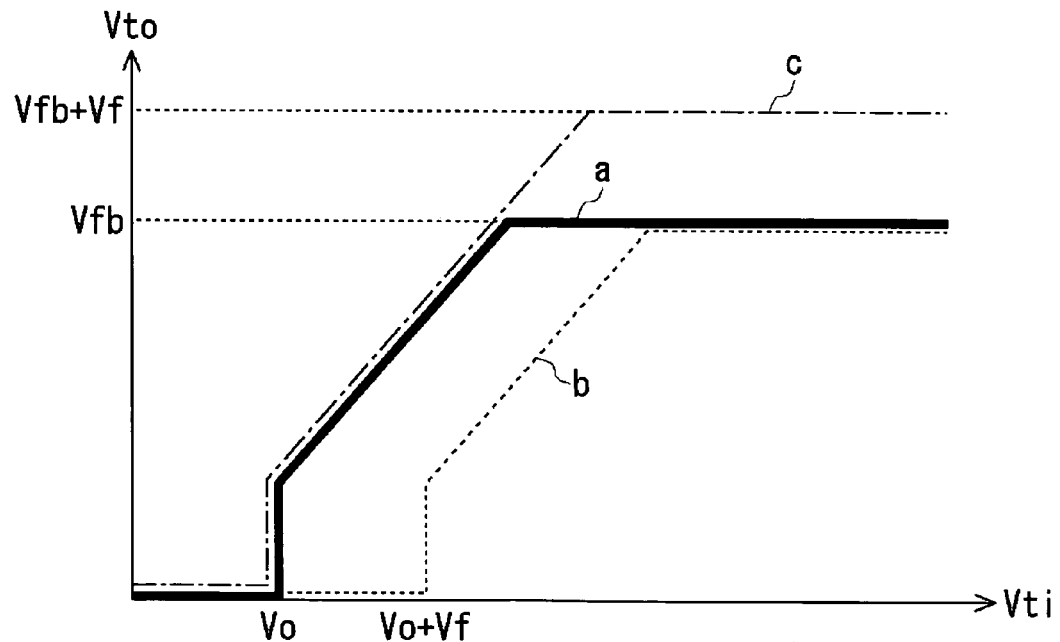
FIG. 2 shows a principle of detecting a failure due to an open wire in the semiconductor device according to the first embodiment.

FIG. 2 shows a principle of detecting a failure due to an open wire. In a test, a voltage that gradually varies from zero to a higher voltage (hereinafter, referred to as a test input voltage and denoted by Vti) is applied to the input terminal Pi2. A voltage that appears at the output terminal Po2 (hereinafter, referred to as a test output voltage and denoted by Vto) is observed. In the figure, the lines indicate the behavior of Vto with respect to Vti when (a) the wires are in a normal condition, (b) the output wire Wo1 is disconnected and (c) the feedback wire Wf1 is disconnected. For ease of viewing, lines are shown to be displaced from each other where overlapping of lines occurs.

(1) Normal Condition

Vto does not rise to an appreciable level until Vti=V0. V0 corresponds to the source-drain voltage occurring when the transistor Q1 starts to operate. Vto increases linearly until Vto=Vfb. Subsequently, Vto=Vfb is maintained.

(2) When the Output Wire Wo1 is Disconnected

Vto does not rise to an appreciable level until Vti=V0+Vf. Vf is a forward drop voltage of the transistor Q1. Vto and Vti are in this relation because Vto occurs at the output terminal Po2 via the drain of the transistor Q1, the first diode D1 and the feedback wire Wf1. For this reason, a failure can be discovered by a reduced voltage test.

(3) When the Feedback Wire Wf1 is Disconnected

Vto rises to an appreciable level at Vti=V0. Subsequently, Vto increases linearly, as in (1). However, the increase does not stop at Vto=Vfb but continues until Vto=Vfb+Vf. The output voltage is maintained at that level subsequently. Vti and Vto are in this relation because Vfb' occurs as an output voltage past the first diode D1. For this reason, a failure can be discovered by a reduced voltage test.

A failure of open input wire Wi1 is also conceivable. In this case, Vto is not observed as Vti varies so that detection is easy.

Thus, according to the first embodiment, detection of an open wire by a test using a weak current is possible by utilizing diodes. Even when a wire is disconnected, the output voltage and the feedback voltage are maintained at levels close to each other due to the diodes. Consequently, the likelihood of the load device 31 being damaged as a result of the output voltage growing to an excessively high level is lessened.

Second Embodiment

Figure 3:
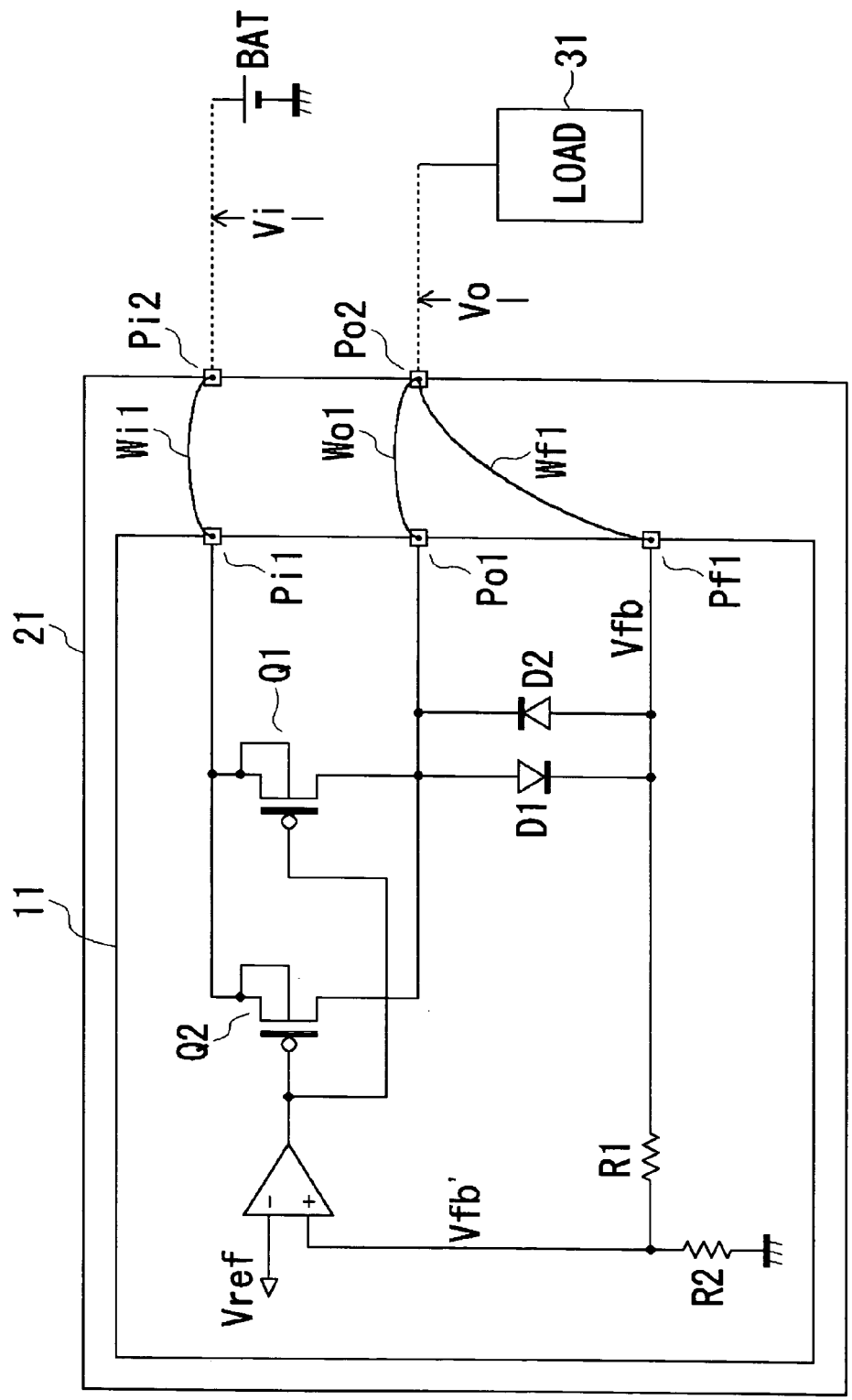
FIG. 3 shows a construction of a semiconductor device according to a second embodiment of the present invention.

FIG. 3 shows a circuit of a semiconductor device according to a second embodiment of the present invention. Hereinafter, those components that are similar to the corresponding components of the first embodiment are designated by the same reference symbols and the description thereof is omitted. A difference from the first embodiment is that there are two transistors used in a regulator. The arrangement of the first transistor Q1 is the same as that of the first embodiment. The gate, source and drain of an additional, second transistor Q2 are connected to the gate, source and drain of the first transistor Q1. Accordingly, the second transistor Q2 behaves in the same manner as the first transistor Q1. According to the second embodiment, even when the size of each of the transistors is relatively small, the necessary driving capability is secured by providing two transistors. Detection of an open wire in the above construction is the same as that of the first embodiment.

Third Embodiment

Figure 4:
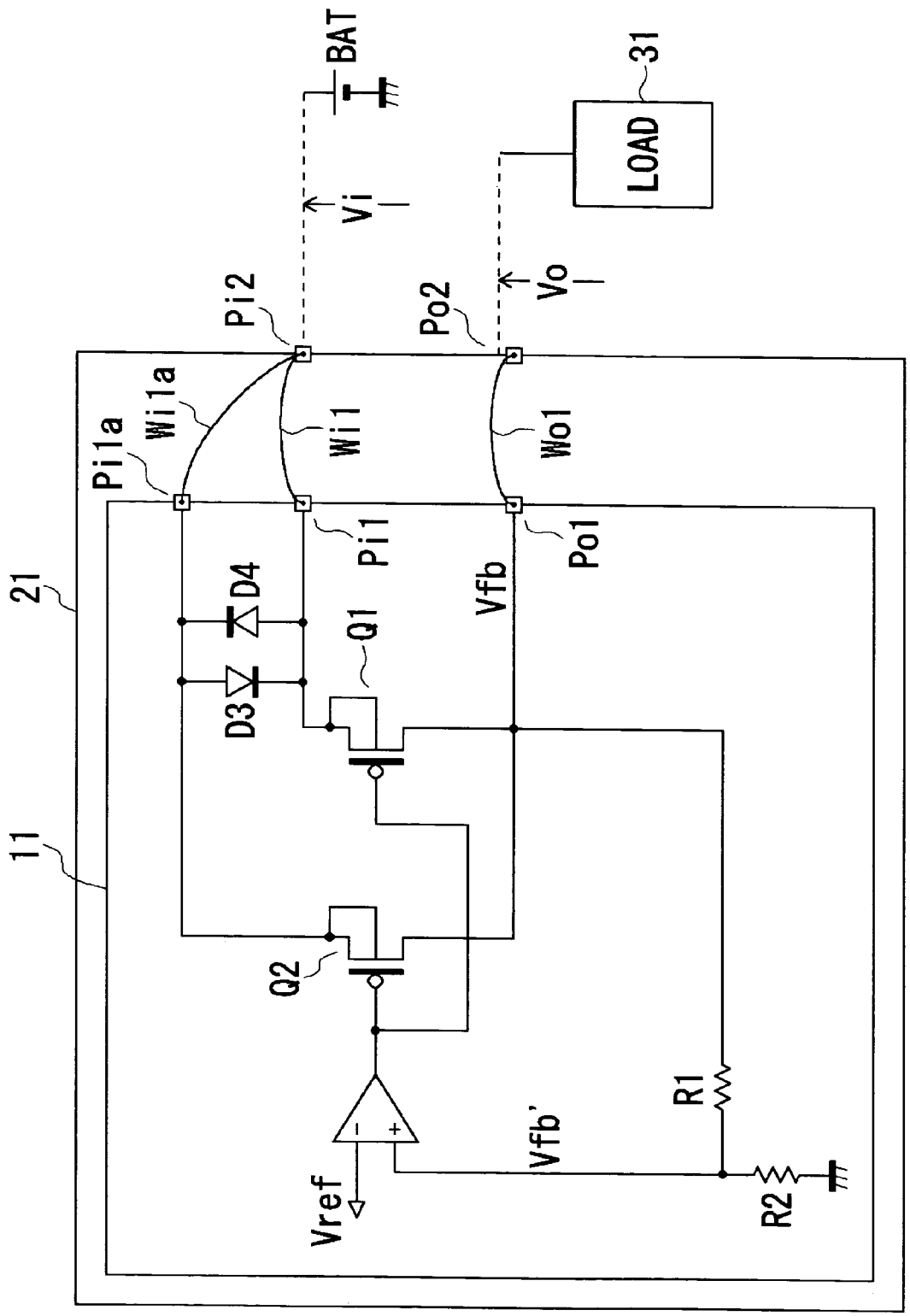
FIG. 4 shows a construction of a semiconductor device according to a third embodiment of the present invention.

FIG. 4 shows a circuit of a semiconductor device according to a fourth embodiment of the present invention. Hereinafter, those components that are similar to the corresponding components of the second embodiment are designated by the same reference symbols and the description thereof is omitted. A difference from the second embodiment is that two pads are provided at the input instead of at the output, and diodes are connected across the input pads. Thus, the third embodiment is configured such that two pads of a regulator circuit constituting two systems receive a battery voltage so as to generate a desired voltage. As shown in FIG. 4, a second input pad Pi1a is provided and is connected to the input terminal Pi2 by a wire. The feedback pad Pf1 is eliminated and the first and second diodes D1 and D2 are also eliminated. The drains of the first and second transistors Q1 and Q2 are directly connected to the output pad Po1. The source of the first transistor Q1 is connected in the same manner as that of the second embodiment. The source of the second transistor Q2 is connected to the additional input pad Pi1a. Third and fourth diodes D3 and D4 are connected between the drain of the second transistor Q2 and that of the first transistor Q1. The forward direction of the third diode D3 is from the drain of the second transistor Q2 to that of the first transistor Q1. The forward direction of the fourth diode D4 is opposite to that of the diode D3. Detection of an open wire in the above construction is performed as follows.

(1) When the Additional Input Wire Wi1a is Disconnected

The source potential of the second transistor Q2 drops from Vti by a forward drop voltage Vf of the fourth diode D4 so that the second transistor Q2 is more weakly on. As a result of this, the driving capability of the IC chip 11 as a whole drops so that an open wire is detected by monitoring the driving current at the output terminal Po2. Even when the wire is disconnected, an excessive load is prevented from being imposed on the first transistor Q1 by ensuring that the second transistor Q2 is operated partially.

(2) When the Originally Provided Input Wire Wi1 is Disconnected

Detection is possible in the same manner as (1).

(3) When the Originally Provided Wire Wo1 is Disconnected

Naturally, even when Vti varies, Vto is not observed so that detection is easy.

Fourth Embodiment

Figure 5:
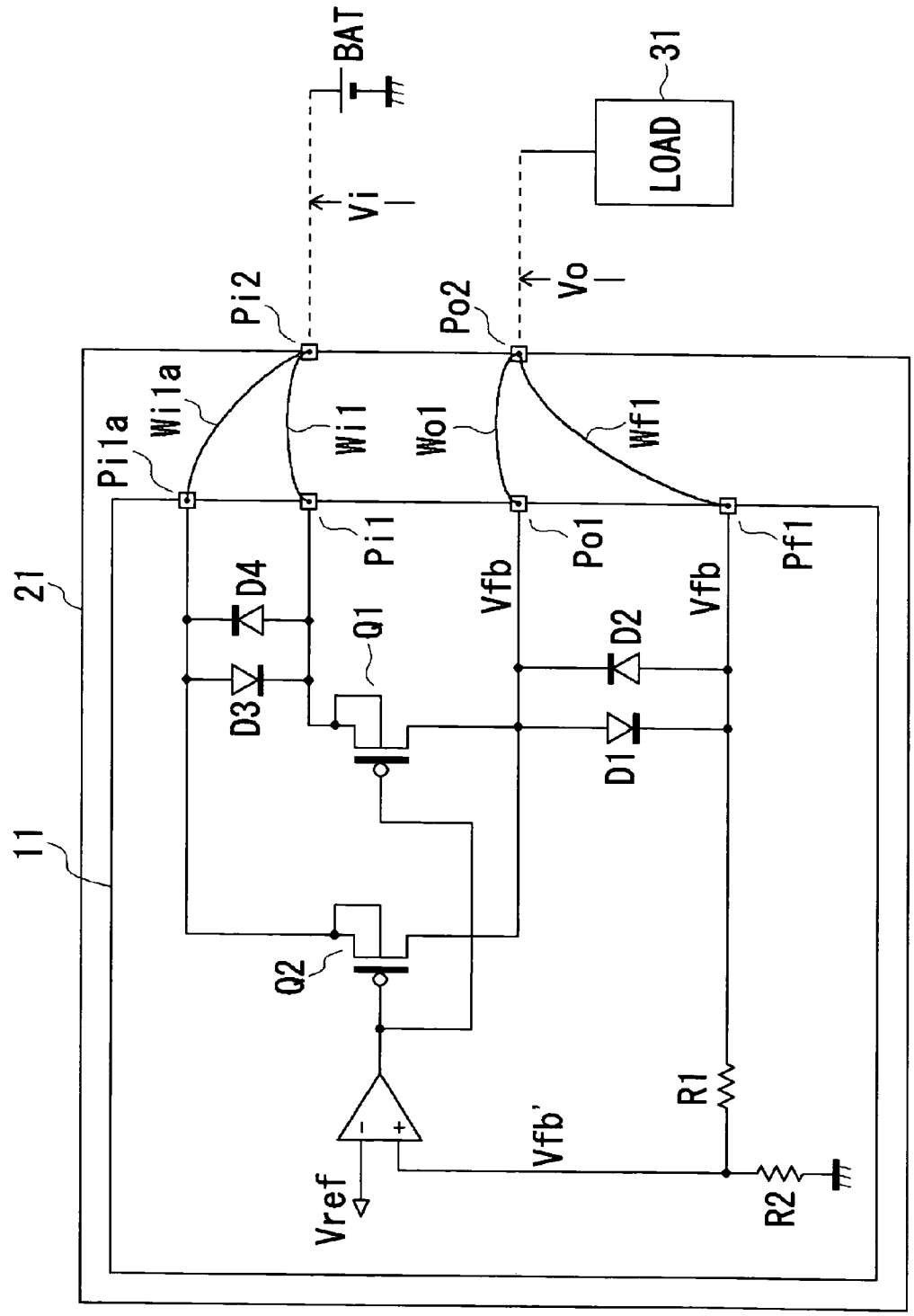
FIG. 5 shows a construction of a semiconductor device according to a fourth embodiment of the present invention.

FIG. 5 shows a circuit of a semiconductor device according to a fourth embodiment of the present invention. The fourth embodiment is a combination of the second and third embodiments. Two pads are provided both at the input and output. More specifically, the input is constructed in the same manner as the third embodiment. The output is constructed in the same manner as the second embodiment. Accordingly, detection of an open wire at the input using the same method as used in the third embodiment is possible, and detection of an open wire at the output using the same method as used in the second embodiment is possible.

The fourth embodiment provides the same advantageous effect as that of the second and third embodiments. A failure due to an open wire is detected using a weak current. Further, even when the wire at the output is disconnected, the load device 31 is less likely to be damaged. Even when the wire at the input is disconnected, the transistors are not likely to be overloaded. Since multiple channels are provided both at the input and the output, the fourth embodiment is adapted for driving of the load using a large current.

Fifth Embodiment

Figure 6:
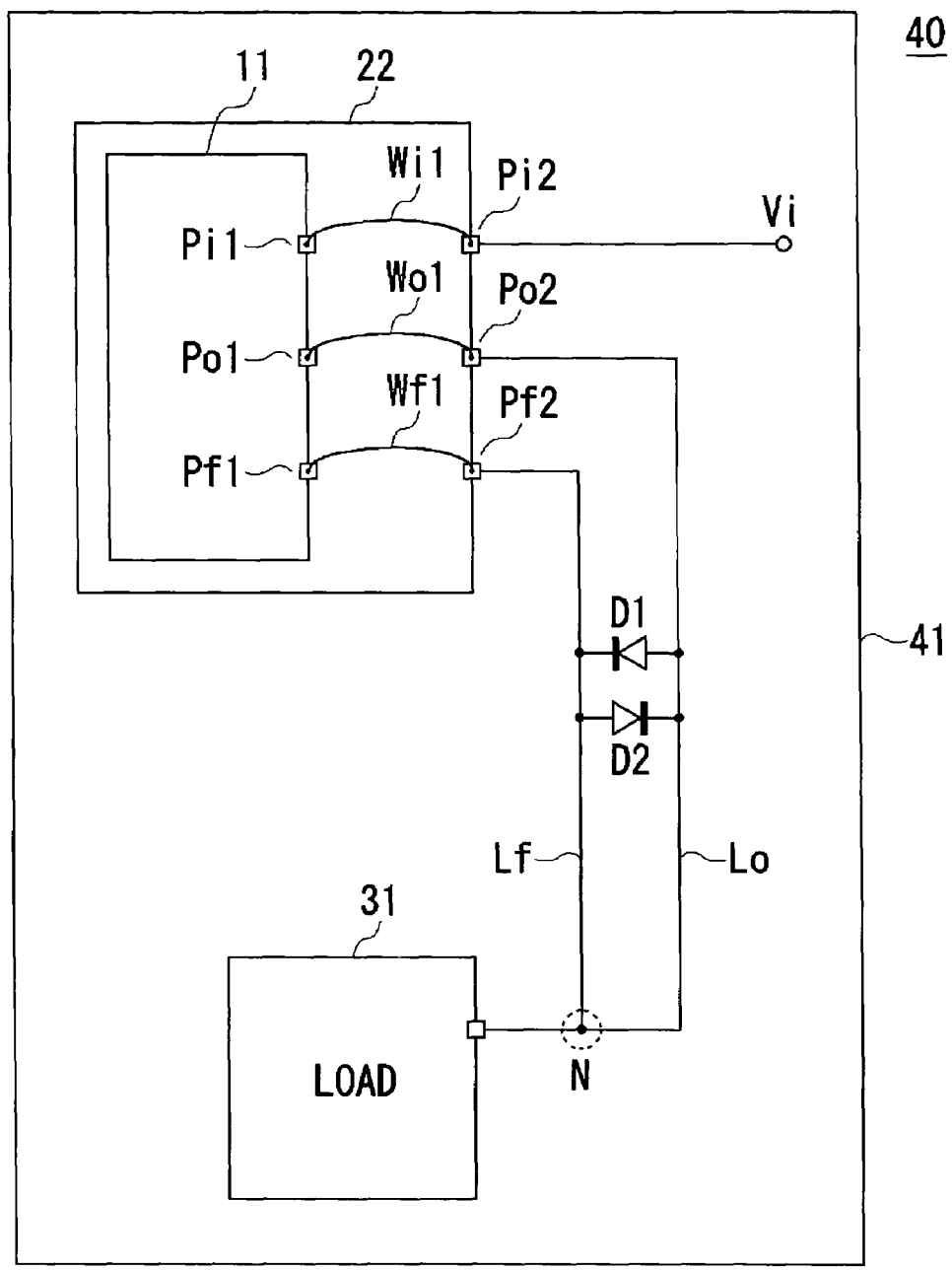
FIG. 6 shows a construction of a semiconductor device according to a fifth embodiment of the present invention.

FIG. 6 is a schematic diagram showing an electronic appliance in which the semiconductor device according to the first embodiment is mounted. While the diodes are provided inside the semiconductor device in the first embodiment, the diodes are provided outside the device in the fifth embodiment. While the output pin Po2 is also used as a feedback pin in the first embodiment, an additional, feedback pin Pf2 is provided in this embodiment.

The semiconductor device 21 and the load device 31 are mounted on a printed circuit board 41 of an electronic appliance 40. The output terminal Po2 of the semiconductor device 21 and the input terminal of the load device 31 are connected to each other by an output wire Lo formed on the printed circuit board 41. The feedback pin Pf2 of the semiconductor device 21 is connected to a node N on the output wire Lo by a feedback wire Lf. An input voltage Vi is applied to the input terminal Pi2 via a patterned wiring. The first diode D1 is placed on the printed circuit board in a direction from the output wire Lo to the feedback wire Lf and the second diode D2 is connected in an opposite direction.

With the construction described above, the same advantageous effect as provided by the first embodiment, i.e. protection of the load device 31 and easy detection of an open wire, is provided without any diodes provided inside the semiconductor device 21. According to the fifth embodiment, it is possible to detect, in the process of printed circuit board implementation test, not only an open wire inside the semiconductor device 21 but also a failure due to an open wire caused by improper soldered connection of the output pin Po2 and the feedback pin Pf2 occurring when the semiconductor device 21 is mounted on the printed circuit board 41.

Described above is an explanation based on the embodiments. The embodiments of the present invention are only illustrative in nature and it will be obvious to those skilled in the art that various variations are possible within the scope of the present invention.

In the embodiments described above, it is assumed that MOS transistors are used. Alternatively, transistors may be bipolar transistors.

In the embodiment, it is assumed that a series regulator is used as a regulator. Alternatively, regulators of other types such as a switching regulator and a charge pump regulator may be provided instead.

Although the present invention has been described by way of exemplary embodiments, it should be understood that many changes and substitutions may further be made by those skilled in the art without departing from the scope of the present invention which is defined by the appended claims.

What is claimed is:

1. A semiconductor device comprising:
    an IC chip having first and second pads;
    a terminal which is provided exterior to the IC chip and connected to both the first and second pads via bonding wires, wherein
    the IC chip further includes:
    an internal circuit;
        a first signal line having one end thereof connected to the first pad and the other end connected to the internal circuit;
        a second signal line having one end thereof connected to the second pad and the other end connected to the internal circuit; and
        a diode having one end thereof connected to the first signal line and the other end connected to the second signal line;
    wherein said terminal is an input terminal,
    said semiconductor device further comprising:
    a regulator circuit for generating a desired voltage from a power supply voltage applied to said input terminal; and
    an output terminal for outputting the desired voltage thus generated, wherein said regulator circuit is configured to receive the power supply voltage by two systems including the first signal line and the second signal line and generate the desired voltage.

2. A semiconductor device comprising:
an IC chip having first and second pads;
a terminal which is provided exterior to the IC chip and connected to both the first and second pads via bonding wires, wherein
the IC chip further includes:
an internal circuit;
  a first signal line having one end thereof connected to the first pad and the other end connected to the internal circuit;
  a second signal line having one end thereof connected to the second pad and the other end connected to the internal circuit; and
  a diode having one end thereof connected to the first signal line and the other end connected to the second signal line;
wherein said terminal is an output terminal,
said semiconductor device further comprising:
an input terminal to which a predetermined power supply voltage is applied; and
a regulator circuit for generating a desired voltage from the power supply voltage, wherein
the desired voltage is transmitted to the first signal line or the second signal line.

3. A semiconductor device comprising:
an input terminal to which a power supply voltage is applied;
a regulator circuit formed on an IC chip for generating a desired voltage from the power supply voltage; and
an output terminal for outputting the desired voltage thus generated, wherein
the IC chip includes:
  a plurality of IC chip pads connected to either the input terminal or the output terminal by bonding wires;
  a plurality of signal lines each having one end thereof connected to one of the IC chip pads and the other end connected to the regulator circuit; and
  a diode having one end thereof connected to one of the plurality of signal lines and the other end connected to another one of the plurality of signal lines.

4. An electronic apparatus on which a semiconductor device and a load device are mounted,
said semiconductor device comprising:
an input terminal to which a power supply voltage is applied;
a regulator circuit for generating a desired voltage from the power supply voltage; and
an output terminal for outputting the desired voltage thus generated, wherein
  a plurality of IC chip pads are provided for at least one of a) the input terminal and b) the output terminal selected,
  a plurality of signal transmission channels are provided by connecting the selected terminal to the plurality of IC chip pads by bonding wires, and the signal transmission channels are coupled to each other by a. diode either inside said semiconductor device or at an interface between said semiconductor device and the load device.

* * * * *